США012334957B1

United States Patent
Levanen

(10) Patent No.: US 12,334,957 B1
(45) Date of Patent: Jun. 17, 2025

(54) LLR COMPRESSION IN WIRELESS COMMUNICATIONS NETWORKS

(71) Applicant: Nokia Solutions and Networks Oy, Espoo (FI)

(72) Inventor: Toni Aleksi Levanen, Tampere (FI)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 18/999,272

(22) Filed: Dec. 23, 2024

(30) Foreign Application Priority Data

Dec. 29, 2023 (FI) .................................... 20236455

(51) Int. Cl.
*H03M 13/00* (2006.01)
*H03M 13/39* (2006.01)

(52) U.S. Cl.
CPC ................ *H03M 13/3927* (2013.01)

(58) Field of Classification Search
None
See application file for complete search history.

(56) References Cited

U.S. PATENT DOCUMENTS

| | | | |
|---|---|---|---|
| 8,270,543 B1 * | 9/2012 | Fattal | H04L 1/1812 714/795 |
| 8,867,673 B2 | 10/2014 | Wilborn et al. | |
| 8,989,088 B2 | 3/2015 | Ling | |
| 9,425,922 B2 | 8/2016 | Engin | |
| 11,032,031 B2 | 6/2021 | Jiang et al. | |
| 2009/0285276 A1 * | 11/2009 | Heikkila | H04L 25/067 375/232 |
| 2016/0085615 A1 * | 3/2016 | Nekuii | H03M 13/3723 714/776 |
| 2016/0087757 A1 | 3/2016 | Nekuii | |
| 2018/0109354 A1 * | 4/2018 | Ahirwar | H03M 13/1102 |
| 2021/0409164 A1 * | 12/2021 | Shieh | H03M 13/1114 |
| 2023/0079699 A1 * | 3/2023 | Palgy | H04L 1/1845 370/230 |

FOREIGN PATENT DOCUMENTS

| | | |
|---|---|---|
| WO | 2016/045733 A1 | 3/2016 |
| WO | 2016045733 A | 3/2016 |
| WO | 2021/187848 A1 | 9/2021 |

(Continued)

OTHER PUBLICATIONS

Rosati et al., "LLR Compression for BICM Systems Using Large Constellations", arXiv, Apr. 16, 2013, pp. 1-12.

(Continued)

*Primary Examiner* — Mujtaba M Chaudry
(74) *Attorney, Agent, or Firm* — Nokia Technologies Oy

(57) ABSTRACT

At least one example embodiment provides a radio access network element comprising at least one processor and at least one memory. The at least one memory stores instructions that, when executed by the at least one processor, cause the radio access network element to: extract sign information from a plurality of log-likelihood ratio (LLR) sample values included in LLR data in a resource block group (RBG); convert negative LLR sample values, from among the plurality of LLR sample values, into positive integer values to obtain converted LLR data; generate compressed LLR data based on the converted LLR data; and output the compressed LLR data.

12 Claims, 7 Drawing Sheets

(56) References Cited

FOREIGN PATENT DOCUMENTS

WO  2022/005709 A1  1/2022
WO  2023/070055 A1  4/2023

OTHER PUBLICATIONS

Cisek, "eCPRI LLR interface for Mako-Thor use-case (Mako PoC)", Nokia, version 0.2, 2022, pp. 1-51.
"3rd Generation Partnership Project; Technical Specification Group Radio Access Network; NR; Physical channels and modulation (Release 16)", 3GPP TS 38.211, V16.6.0, Jun. 2021, pp. 1-134.
"3rd Generation Partnership Project; Technical Specification Group Radio Access Network; Evolved Universal Terrestrial Radio Access (E-UTRA); Physical channels and modulation (Release 16)", 3GPP TS 36.211, V16.0.0, Dec. 2019, 246 pages.
"Arm RAN Acceleration Library", Arm Limited, 2020-2021, 85 pages.
"O-RAN Working Group 4 (Open Fronthaul Interfaces WG Control, User and Synchronization Plane Specification", O-Ran Alliance, O-RAN.WG4.CUS.0-R003-v13.00, 2023, pp. 1-416.
Office Action received for corresponding Finnish Patent Application No. 20236455, dated Jun. 27, 2024, 10 pages.
Rajagopal, "EDGE Q 5G with an EDGE", IEEE Hot Chips 33 Symposium (HCS), Aug. 22-24, 2021, pp. 1-13.
Office Action received for corresponding Finnish Patent Application No. 20236455, dated Nov. 20, 2024, 5 pages.
Extended European Search Report received for corresponding European Patent Application No. 24222957.3-1218, dated May 5, 2025, 10 pages.
Marcos, Silva et al., A New O-RAN Compression Approach for Improved Performance on Uplink Signals, Journal of Communication and Information Systems, vol. 37, No. 1, dated Jan. 1, 2022, 30-41 pages.
O-RAN Fronthaul Working Group 4: "Control, User and Synchronization Plane Specification", Internet Citation, dated Aug. 2, 2019, 1-128 pages.

* cited by examiner

LLR COMPRESSION IN WIRELESS COMMUNICATIONS NETWORKS

RELATED APPLICATION

This application claims benefit of priority from Finnish Patent App. No. 20236455, filed Dec. 29, 2023, the disclosure of which is hereby incorporated in its entirety by reference herein.

TECHNICAL FIELD

One or more example embodiments relate to wireless communications networks.

BACKGROUND

Fifth generation (5G) wireless communications networks are the next generation of mobile communications networks. Standards for 5G networks are currently being developed by the 3rd Generation Partnership Project (3GPP). These standards are known as 3GPP New Radio (NR) standards.

SUMMARY

One or more example embodiments provide a hardware (HW) implementation friendly log-likelihood ratio (LLR) compression technique for generating LLR bit estimates for (e.g., uplink) transmission of data between a radio unit (RU) and distributed unit (DU) devices via a fronthaul network. One or more example embodiments may decrease transfer data rates and/or the number of wireline connections needed between RU and DU devices. One or more example embodiments may also allow for transfer data rates closer to what is needed in earlier enhanced common public radio interface (eCPRI) solutions, where compressed frequency domain (FD) I/Q samples of equalized symbol estimates are transmitted from RU to DU. For example, in a sub-urban environment using modulation and coding scheme (MCS) index table 1, one or more example embodiments may provide a lesser data rate than with FD I/Q samples.

Unlike existing block floating point (BFP) compression methods, one or more example embodiments at least: simplify processing by utilizing only real value samples; provide a special handling of values quantized to zero (reserve signal sign); provide a variable RBG size to align with receiver chain parameterization or to improve and/or optimize performance versus compression tradeoff; and may use MCS specific compression parameters to optimize average compression rates and to reduce and/or minimize eCPRI traffic. It should be noted that other link information, such as number of co-scheduled layers, may be used to finetune the compression parameterization.

At least one example embodiment provides a radio access network element comprising at least one processor and at least one memory. The at least one memory stores instructions that, when executed by the at least one processor, cause the radio access network element to: extract sign information from a plurality of log-likelihood ratio (LLR) sample values included in LLR data in a resource block group (RBG); convert negative LLR sample values, from among the plurality of LLR sample values, into positive integer values to obtain converted LLR data; generate compressed LLR data based on the converted LLR data; and output the compressed LLR data.

At least one example embodiment provides a radio access network element comprising: means for extracting sign information from a plurality of log-likelihood ratio (LLR) sample values included in LLR data in a resource block group (RBG); means for converting negative LLR sample values, from among the plurality of LLR sample values, into positive integer values to obtain converted LLR data; means for generating compressed LLR data based on the converted LLR data; and means for outputting the compressed LLR data.

At least one other example embodiment provides a method comprising: extracting sign information from a plurality of log-likelihood ratio (LLR) sample values included in LLR data in a resource block group (RBG); converting negative LLR sample values, from among the plurality of LLR sample values, into positive integer values to obtain converted LLR data; generating compressed LLR data based on the converted LLR data; and outputting the compressed LLR data.

At least one other example embodiment provides a non-transitory computer-readable medium or computer program product storing computer-executable instructions that, when executed by at least one processor at a radio access network element, cause the radio access network element to perform a method comprising: extracting sign information from a plurality of log-likelihood ratio (LLR) sample values included in LLR data in a resource block group (RBG); converting negative LLR sample values, from among the plurality of LLR sample values, into positive integer values to obtain converted LLR data; generating compressed LLR data based on the converted LLR data; and outputting the compressed LLR data.

At least one other example embodiment provides a radio access network element comprising at least one processor and at least one memory. The at least one memory stores instructions that, when executed by the at least one processor, cause the radio access network element to: scale, based on a decompression scaling factor, compressed LLR data including a plurality of LLR sample values for a RBG to obtain scaled LLR data; set zero value samples of the scaled LLR data to a value of 1; and recover decompressed LLR data by introducing sign information to the scaled LLR data.

At least one other example embodiment provides a radio access network element comprising: means for scaling, based on a decompression scaling factor, compressed LLR data including a plurality of LLR sample values for a RBG to obtain scaled LLR data; means for setting zero value samples of the scaled LLR data to a value of 1; and means for recovering decompressed LLR data by introducing sign information to the scaled LLR data.

At least one other example embodiment provides a method comprising: scaling, based on a decompression scaling factor, compressed LLR data including a plurality of LLR sample values for a RBG to obtain scaled LLR data; setting zero value samples of the scaled LLR data to a value of 1; and recovering decompressed LLR data by introducing sign information to the scaled LLR data.

At least one other example embodiment provides a non-transitory computer-readable medium or computer program product storing computer-executable instructions that, when executed by at least one processor at a radio access network element, cause the radio access network element to perform a method comprising: scaling, based on a decompression scaling factor, compressed LLR data including a plurality of LLR sample values for a RBG to obtain scaled LLR data; setting zero value samples of the scaled LLR data to a value of 1; and recovering decompressed LLR data by introducing sign information to the scaled LLR data.

At least one other example embodiment provides a radio access network element comprising at least one processor and at least one memory. The at least one memory stores instructions that, when executed by the at least one processor, cause the radio access network element to: obtain, based on a plurality of input parameters, a plurality of compression parameters for compressing LLR data for an RBG, wherein the plurality of compression parameters include a dimension and size for the RBG, an output mantissa length for the RBG and an exponent length for the RBG, and wherein the input parameters include a transmission channel capacity, a total resource block (RB) count, an input mantissa length, and one of a modulation and coding scheme (MCS) per physical RB (PRB) layer or UE allocation information; and decompress received LLR data based on the plurality of compression parameters.

At least one other example embodiment provides a radio access network element comprising: means for obtaining, based on a plurality of input parameters, a plurality of compression parameters for compressing LLR data for an RBG, wherein the plurality of compression parameters include a dimension and size for the RBG, an output mantissa length for the RBG and an exponent length for the RBG, and wherein the input parameters include a transmission channel capacity, a total resource block (RB) count, an input mantissa length, and one of a modulation and coding scheme (MCS) per physical RB (PRB) layer or UE allocation information; and means for decompressing received LLR data based on the plurality of compression parameters.

At least one other example embodiment provides a method comprising: obtaining, based on a plurality of input parameters, a plurality of compression parameters for compressing LLR data for an RBG, wherein the plurality of compression parameters include a dimension and size for the RBG, an output mantissa length for the RBG and an exponent length for the RBG, and wherein the input parameters include a transmission channel capacity, a total resource block (RB) count, an input mantissa length, and one of a modulation and coding scheme (MCS) per physical RB (PRB) layer or UE allocation information; and decompressing received LLR data based on the plurality of compression parameters.

At least one other example embodiment provides a non-transitory computer-readable medium or computer program product storing computer-executable instructions that, when executed by at least one processor at a radio access network element, cause the radio access network element to perform a method comprising: obtaining, based on a plurality of input parameters, a plurality of compression parameters for compressing LLR data for an RBG, wherein the plurality of compression parameters include a dimension and size for the RBG, an output mantissa length for the RBG and an exponent length for the RBG, and wherein the input parameters include a transmission channel capacity, a total resource block (RB) count, an input mantissa length, and one of a modulation and coding scheme (MCS) per physical RB (PRB) layer or UE allocation information; and decompressing received LLR data based on the plurality of compression parameters.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of this disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

It should be understood that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

It will be appreciated that a number of example embodiments described herein may be used in combination.

While one or more example embodiments may be described with regard to an electronic device or radio access network (RAN) element, such as a remote unit (RU) or distributed unit (DU), it should be understood that one or more example embodiments discussed herein may be applicable to and/or performed by one or more processors (or processing circuitry) at the applicable device or network element. For example, according to one or more example embodiments, at least one memory may include or store computer-executable instructions that, when executed by at least one processor, cause the electronic device to perform one or more operations discussed herein.

As discussed herein, the term 'a' or 'an' entity refers to one or more of that entity. Moreover, the terminology 'a', 'an', 'one or more' and 'at least one' may be used interchangeably.

Although example embodiments may be discussed with regard to an enhanced common public radio interface (eCPRI), example embodiments should not be limited to this example. Rather, mechanisms discussed herein may be utilized in other implementations, such as storing log-likelihood ratios (LLRs) in memory (e.g., for substantial lengths of time, such as in relation to Hybrid Automatic Repeat Request (HARQ) process).

Figure 1:
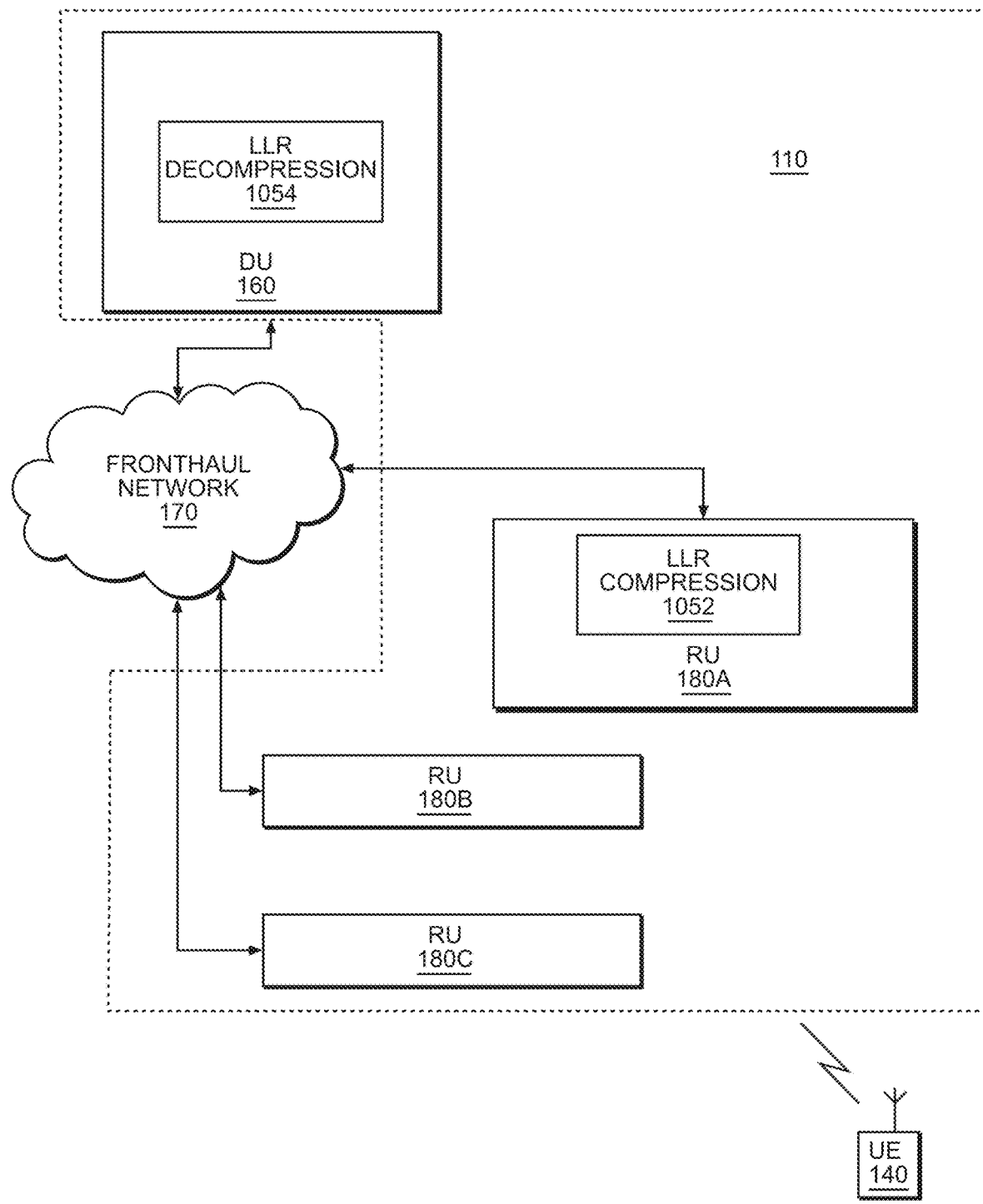
FIG. 1 illustrates an example of a fronthaul structure of a base station according to example embodiments.

FIG. 1 illustrates an example of a fronthaul structure of a base station according to example embodiments.

Referring to FIG. 1, a gNB (or more generally a base station) 110 may include a distributed unit (DU) 160 and a plurality of radio units (RUs) 180A, 180B and 180C, The DU 160 and the RUs 180A-180C are separated geographically with the RUs 180A-180C being connected to the DU 160 via a fronthaul (e.g. wired) network 170. The RUs 180A-180C are distributed geographically to provide wireless connectivity and resources (e.g., to user equipment (UE) 140) to a larger geographic area. Although only three RUs and one UE are shown in FIG. 1, example embodiments should not be limited to this example.

The fronthaul network 170 between the DU 160 and the RUs 180A-180C may be operated via an interface, such as an eCPRI. In addition to the structure and functionality described herein with regard to example embodiments, the DU 160 may include known components and may be implemented to perform functions for the packet data convergence protocol (PDCP), the radio link control (RLC), the media access control (MAC), and/or the physical WHY) layer.

In more detail, for example, the DU 160 may be perform upper layer functions of a radio network, such as a 5G NR network. For example, the DU 160 may perform a function of the MAC layer and a part of the PHY layer, Here, the part of the PHY layer is a function performed at a higher stage from among functions of the PHY layer, and may include, for example, channel encoding (or channel decoding), scrambling (or descrambling), modulation, and layer mapping (or layer demapping). Additionally, as shown in FIG. 1, the DU 160 includes a log-likelihood ratio (LLR) decompression module (or LLR decompression circuit) 1054. Example functionality of the LLR decompression module 1054 will be discussed in more detail later. In at least one example, the LLR decompression module 1054 may be implemented via one or more processors or other processing circuitry discussed later.

In addition to the structure and functionality discussed herein with regard to example embodiments, the RUs 180A-180C may perform lower layer functions of the radio access network. For example, the RUs 180A-180C may perform a part of the PHY layer and the radio-frequency (RF) function for transmission and reception of data to/from UEs (e.g., UE 140) being served by the base station 110. Here, the part of the PHY layer is a function performed at a lower stage compared to the DU 160 from among the functions of the PHY layer, and may include, for example, an inverse fast Fourier transform (FFT) (IFFT) transformation (or FFT transformation), cyclic prefix (CP) insertion (CP removal), demodulation, and digital beamforming.

An RU may also be referred to as "access unit (AU)," "access point (AP)," "transmission/reception point (TRP)," "remote radio bead (RRH)," or another term having an equivalent technical meaning.

As shown in FIG. 1, the RU ISA includes, inter alia, a LLR compression module (or LLR compression circuit) 1052. Example functionality of the LLR compression module 1052 will be discussed in more detail later. In at least one example, the LLR compression module 1052 may be implemented via one or more processors or other processing circuitry discussed later.

Although not shown or described for the sake of brevity, each of the RUs 180B and 180C may be the same or substantially the same as the RU 180A.

Moreover, although not shown, the DU 160 may further include an LLR compression module 1052 and the RUs 180A-180C may each include the LLR decompression module 1054 such that each of the DL 160 and the RUs 180A-180C include a LLR compression module and a LLR decompression module. In this regard, each of the DU 160 and the RUs 180A-180C may be configured to perform the compression and decompression methods discussed herein. In at least one example, this may be applicable to iterative receiver schemes, in which posteriori LLR information is fed hack from the DU 160 to the RU 180A. This may also facilitate instances in which processing chains including operations that require additional time or in which some estimates need to be postponed in time, wherein the LLRs are compressed for a wait-time, and then decompressed when data is consumed.

As mentioned similarly above, a LLR-based eCPRI interface between a RU, such as RU 180A, and a DU, such as DU 160, requires more bandwidth than a traditional frequency domain (FD) I/Q based eCPRI interface. One or more example embodiments define a hardware (HW) friendly LLR compression technique for compressing data for transmission that allows for reduction in eCPRI interface data traffic over the fronthaul network when transmitting quantized and compressed bit-wise LLR estimates on the uplink (from RU to DU) or the downlink (from DU to RU). One or more example embodiments may also reduce and/or minimize the number of wireline connections (e.g., ethernet, fiber optic, coaxial, or other cables) between RU and DU, and to achieve similar setups as with traditional eCPRI interface. Although example embodiments may be described with regard to uplink communications, it should be understood that example embodiments may also be applicable to the downlink.

Compression methods according to one or more example embodiments may operate on a per bit location per resource block (RB) per Orthogonal Frequency Division Multiplexing (OFDM) symbol basis. Bit location refers to bit locations in bits-to-symbol mapping. As described herein, a RB refers to 12 consecutive subcarriers in the frequency domain (FD) within one OFDM symbol. However, example embodiments should not be limited to only the examples described herein.

Figure 2:
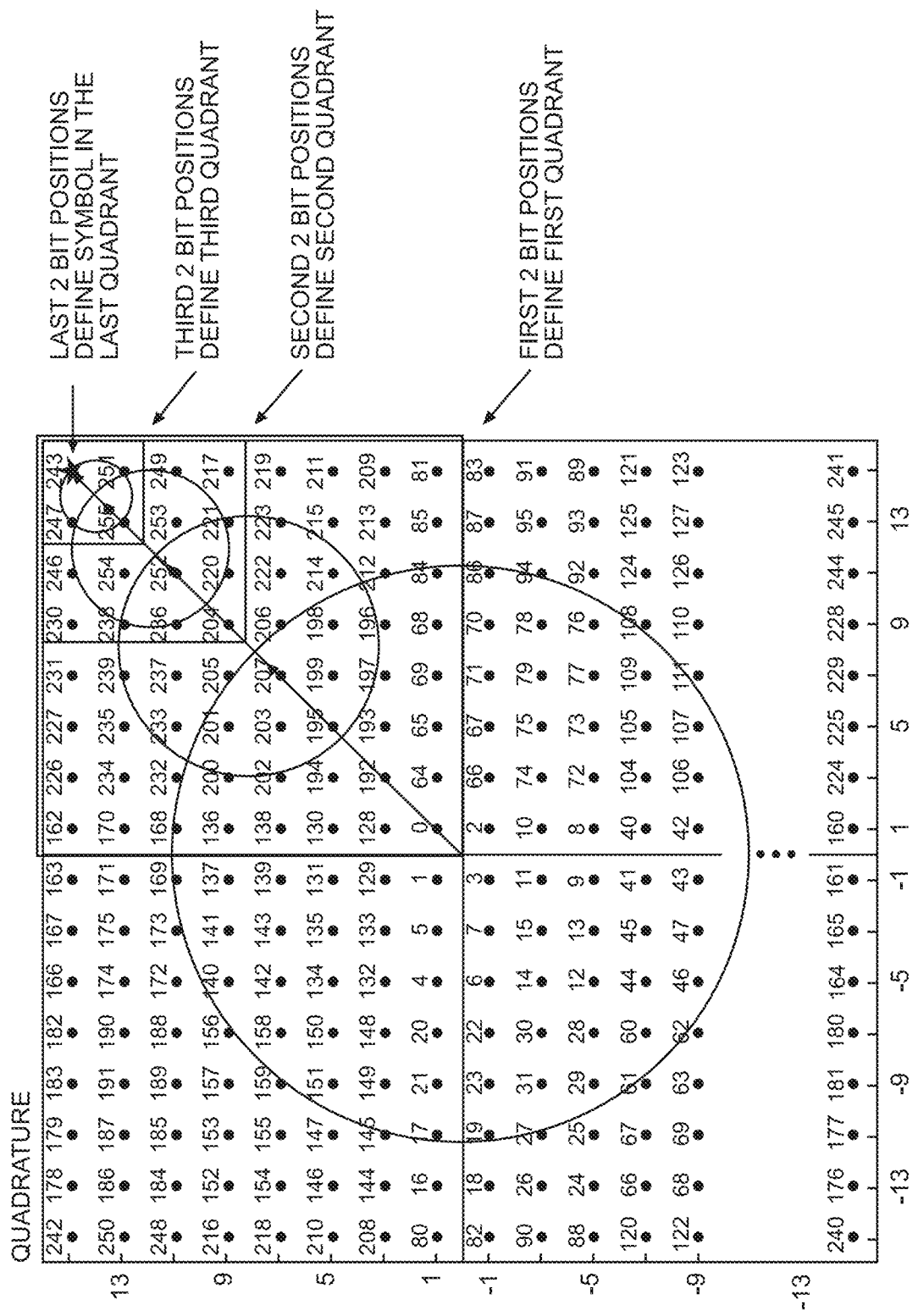
FIG. 2 illustrates an example of a 256 Quadrature Amplitude Modulation (QAM) hierarchical constellation.

In 5G NR and Long-Term Evolution (LTE), hierarchical constellations are used for bit-to-symbol mapping. That is, the first 2 bits map to Quadrature Phase Shift Keying (QPSK), the next 2 bits map to 16-QAM, the next 2 bits map to 64-QAM, and the last 2 bits map to 256-QAM specific bits. Currently, only up to 256-QAM constellation sizes are supported on the 5G NR uplink. FIG. 2 illustrates an example hierarchical bits-to-symbols mapping in a 256-QAM illustration. It has been found that at least with a conventional receiver, the LLR value ranges relate to the bit location or pairs of bit locations.

For example purposes, example embodiments will be described in some instances with regard to the fronthaul structure shown in FIG. 1, and in particular, with regard to transmission in the uplink direction from RU 180A to DU 160 via the fronthaul network 170. It should be understood, however, that RUs 180B and 180C may function in the same or a similar manner to RU 180A.

Figure 3:
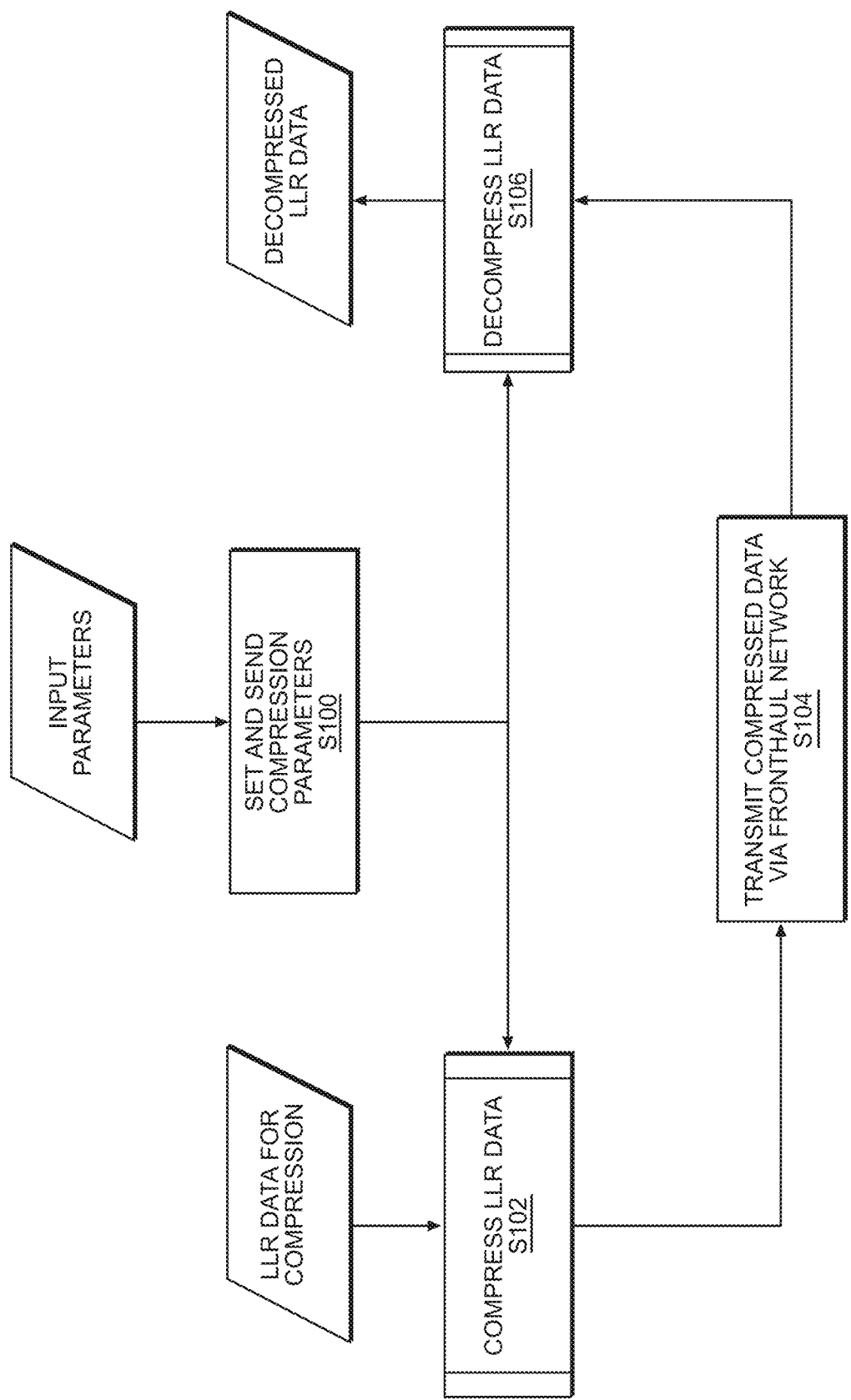
FIG. 3 is a flow chart illustrating a method according to example embodiments.

FIG. 3 is a flow chart illustrating a method for LLR compression parameter setting, LLR compression, LLR decompression and transmission of data according to example embodiments.

Referring to FIG. 3, at S100, the DU 160 sets the compression parameters for LLR compression at the RU 180A and for LLR decompression at the DU 160, based on input parameters provided by the network. In at least one example embodiment, the setting of compression parameters sets the parameters for all input LLR data on a per resource block group (RBG) basis, based on the input parameters. The DU 160 may define the compression parameters per slot, based on dynamic information (depending on scheduler decisions) and static information, which is known a priori at the DU 160. The dynamic information may depend on scheduler decisions, whereas the static information may depend on network configuration (e.g., transfer capacity between the RU 180A and the DU 160) and an input mantissa length. In one example, the compression parameters may be obtained by mapping the input parameters to the compression parameters, wherein the mapping is obtained through an offline optimization.

According to one or more example embodiments, the input parameters may include, for example, transmission channel capacity, total resource block (RB) count, modulation and coding scheme (MCS) per physical RB (PRB) layer or per UE (based on UE allocation information for the UE), and input mantissa length.

Transmission channel capacity may limit the sum-rate of the compressed data to ensure that all compressed LLRs may be transmitted through the assumed medium connecting the RU 180A and the DU 160. Transmission channel capacity may be a fixed parameter, which is fixed while a cell is active and which depends on the capacity of the communications link between RU 180A and the DU 160.

The transmission channel capacity may be set and/or controlled by a network operator. If the transmission channel capacity is smaller than that required by a specific scheduling decision on a specific uplink (UL) slot, then the DU 160 may note this constraint in defining the compression parameters.

Network operators or the provider of the compression/decompression system may choose different schemes for load balancing; for example, focusing on either cell edge UEs (low MCS) or maximum throughput UEs (high MCS).

In a 5G NR network, for example, the total RB count depends on the carrier bandwidth and subcarrier spacing, and is considered to be fixed after cell setup. Total RB count may be used if LLR compression runs over all LLR values in a similar manner to ensure that the number of Physical Resource Blocks (PRBs) aligns with the total number covered by all RBGs.

When RBs are processed without UE context, MCS information per RB is needed for a given UL slot and Physical Uplink Shared Channel (PUSCH) allocation. In this case, compression parameters are defined based on (e.g., only based on) MCS information. The MCS information is used to define compressed mantissa lengths and to define the number of bit positions to be compressed.

MCS per PRB per layer may be used to choose the target compression rate per bit position per PRB per layer and to define RBG size. The RB count, and MCS per RB per layer may vary per time slot (also referred to herein as slot).

As an alternative to MCS per PRB per layer, compression/decompression may be done on a per-user equipment (per-UE) basis for the MCS, which is based on UE allocation information. In this case, the number of allocated RBs and MCS per UE needs to be known, while also changing per slot. In this regard, with a specific UE definition, different compression parameters may be defined for retransmissions. The RB count and MCS per RB per layer may be obtained from link scheduler decisions, thus L2 (Low), which is located at the DU 160.

Compression parameters based on UE allocation information may allow for finer resolution decision making for the compression parameters. For example, special messages such as Message 3 (MSG3), which is an initial PUSCH transmission by the UE as part of initial access procedure, may have looser compression to improve and/or maximize detection probability. Example UE allocation information may include, for example: MCS per UE information, a number of layers per UE, a RB count per UE, a retransmission indicator and/or a Ultra-Reliable Low Latency Communications (URLLC) indicator. The MCS per UE information defines the MCS utilized for the UE (used as described above). The number of layers per UE defines the number of spatial layers allocated for the UE. In some instances, a larger spatial order may make a received signal more error prone and may require looser compression. The RB count per UE is used to ensure that RBGs cover all RBs allocated to a UE when utilizing UE specific LLR compression. The retransmission indicator is a parameter indicating or defining whether the received transport block is a retransmission. Retransmissions may be compressed differently (e.g., in an alternative manner based on different compression parameters) relative to an initial transmission. The URLLC indicator indicates whether the UE is a URLLC UE, such that looser compression or no compression is applied to ensure relatively high detection probability.

Still referring to the input parameters, the input mantissa length defines, together with the selected output mantissa length, the number of bits of the RBG-wise exponent. In practice, a solution based on this description may enable several options of exponent field length, and based on the input parameters and selected compressed mantissa length, a suitable exponent field length may be selected. The input mantissa length may depend on the receive solution generating the LLRs, and may be fixed within a specific device/product, or may be dynamic, depending on the particular implementation.

Turning now to compression parameters, the compression parameters may include a RBG dimension and size for each RBG, an output mantissa length per RBG (also sometimes referred to herein as an output LLR sample length) and an exponent length per RBG. The RBG dimension and size may include other information, such as frequency-time-layer axes for the RBG for finer control on how the LLR data (also referred to herein as LLRs) is compressed. Exponent length may also be a maximum exponent length over all RBGs. For example, assuming 8-bit inputs, a 3 bit exponent may be used.

In one example, the DU 160 may define the RBG per layer and per bit position. This allows for a relatively high level of parallelization in LLR compression. The per layer operation may be simpler, and in some scenarios the number of layers transmitted per UE may be limited to one.

With compression being done per layer and per bit position, the remaining degrees of freedom for RBG relate to the time and frequency axis. In one example, 12 subcarriers per OFDM symbol may be used as the RBG dimensions to align with conventional Block Floating Point (BFP) processing. This example configuration is based on having an interference rejection combining (IRC) receiver process data symbol-by-symbol, in which case per symbol LLR processing is also performed. In other examples, processing multiple symbols simultaneously, extending in the time domain, or even defining the RBG as one subcarrier and all OFDM symbols per PUSCH allocation may be considered. For example purposes, example embodiments are discussed with regard to the RBG dimensions shown in FIG. 6.

The size of the RBG may impact decoding performance, as the common exponent needs to cover more mantissa samples with larger RBG sizes. In one extreme, the RBG size may be 1 subcarrier per OFDM symbol, which shows relatively good performance and allows for reducing and/or minimizing the mantissa length. In this case, however, the overhead of the exponent is relatively significant. With RBG size 12, the cost of each exponent bit is $\frac{1}{12}$ in the output and provides reasonable performance with relatively small cost from exponent. Larger RBG groups may be valuable with smaller MCS, where LLRs appear less sensitive to compression.

Once having determined the RBG dimensions and size, the mantissa and exponent lengths are needed. The sign of the input LLR is assumed as an output. As discussed herein the output mantissa length unsignedMantissaLengthOut refers to the length or number of unsigned mantissa bits to be output by the compression module 1052 after compression of the LLR data.

The output exponent defines the maximum number of unsigned exponent bits per RBG. For example, if input LLRs have an 8-bit signed representation, then a 3-bit exponent may be used. Example embodiments should not be limited to this example, and other suitable values may also be used.

Regarding the output mantissa length, output exponent length, and RBG size, in practice, the values may be selected so that relatively good performance is maintained and byte aligned outputs from the compression engine are utilized. That is, per RBG, given the output mantissa length and the exponent length with the RBG size, the total number of bits used to represent the compressed data should be divisible by 8, since 8 bits define 1 byte.

Returning to FIG. 3, after having set the compression parameters, also at S100 the DU 160 may send the compression parameters to the RU 180A, and more specifically, to the compression module 1052 at the RU 180A such that the compression parameters are known prior to LLR compression at the RU 180A. The compression parameters may be sent in any known manner, such as part of the UL scheduling command message from the DU 160 to the RU 180A. The UL scheduling command message may be provided on a per slot basis. The compression parameters may also be stored in memory at the DU 160.

Once having received the compression parameters, at S102 the compression module 1052 compresses LLR data to obtain compressed LLR data based on the received compression parameters. In one example, the compression module 1052 may extract sign information from a plurality of LLR sample values in a resource block group (RBG); convert negative LLR sample values, from among the plurality of LLR sample values, into positive integer values to obtain converted LLR data; and generate compressed LLR data based on the converted LLR data. The compressed LLR data includes, for each RBG, a sign matrix, unsigned compressed mantissa samples (truncated LLRs) and RBG wise (or per-RBG) exponents. Methods for compressing data according to example embodiments will be discussed in more detail later with regard to FIG. 4.

At S104, the RU 180A processes and transmits (or outputs) the compressed LLR data to the DU 160 via the fronthaul network 170. In at least one example, the compressed LLR data may be transmitted via the eCPRI between the RU 180A and the DU 160.

Upon receipt of the transmitted data, after some initial processing at the DU 160, at S106 the decompression module 1054 decompresses the received data based on the compression parameters set at S100 to recover the LLR data (or estimates of the LLR data) transmitted by the RU 180A. In one example, the decompression module 1054 may scale, based on a decompression scaling factor, the compressed LLR data for a RBG to obtain a plurality of scaled LLR sample values; set any zero value samples, from among the plurality of scaled LLR sample values, to a value of 1; and recover the LLR data by introducing sign information to the plurality of scaled LLR sample values. Methods for decompressing data according to example embodiments will be discussed in more detail later with regard to FIG. 5. The recovered LLR data may then be output for physical layer processing (e.g., channel decoding) and processing of the received data from a UE, such as UE 140 shown in FIG. 1.

Figure 4:
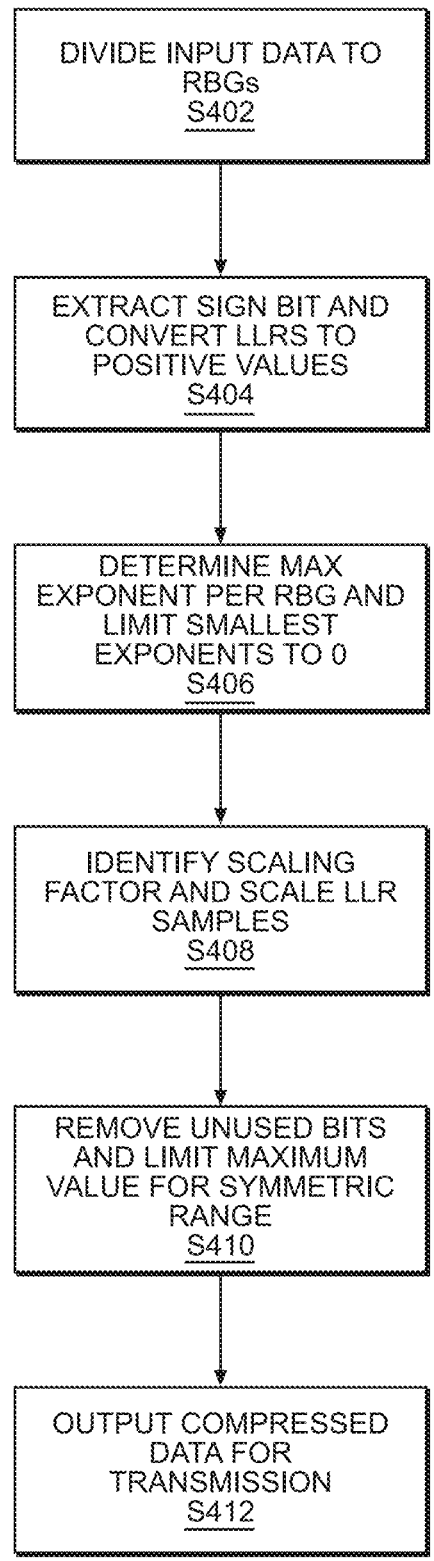
FIG. 4 is a flow chart illustrating a method for log-likelihood ratio (LLR) compression according to example embodiments.

FIG. 4 is a flow chart illustrating a method for compressing LLR data according to example embodiments.

Referring to FIG. 4, at S402 the compression module 1052 divides the LLR data into RBGs. Dimensions for RBGs may be chosen based at least partly on similarity between LLR data values. Because mantissa values share a common exponent, it is preferable that LLR data is divided into RBGs such that LLRs in a similar range are grouped into a RBG. Reliability trends in the LLR and balancing performance versus exponent overhead may be used to divide the LLR data into RBGs.

In one example, the division of the LLR data into RBGs may be similar, but more general than, that used in the BFP algorithm. In BFP, operations are always defined per OFDM symbol (per layer) and over a RB corresponding to 12 subcarriers per resource elements (REs). According to one or more example embodiments, however, a RBG may extend over spatial layers, bit positions within the complex data bearing symbol, frequency, and/or time. As is generally understood, spatial layers are on top of OFDM symbols. For example, per spatial layer may have the time-frequency grid spanned by OFDM symbols and subcarriers, and then these layers overlap with each other (over the third dimension, as time and frequency provide first and second dimension).

Figure 6:
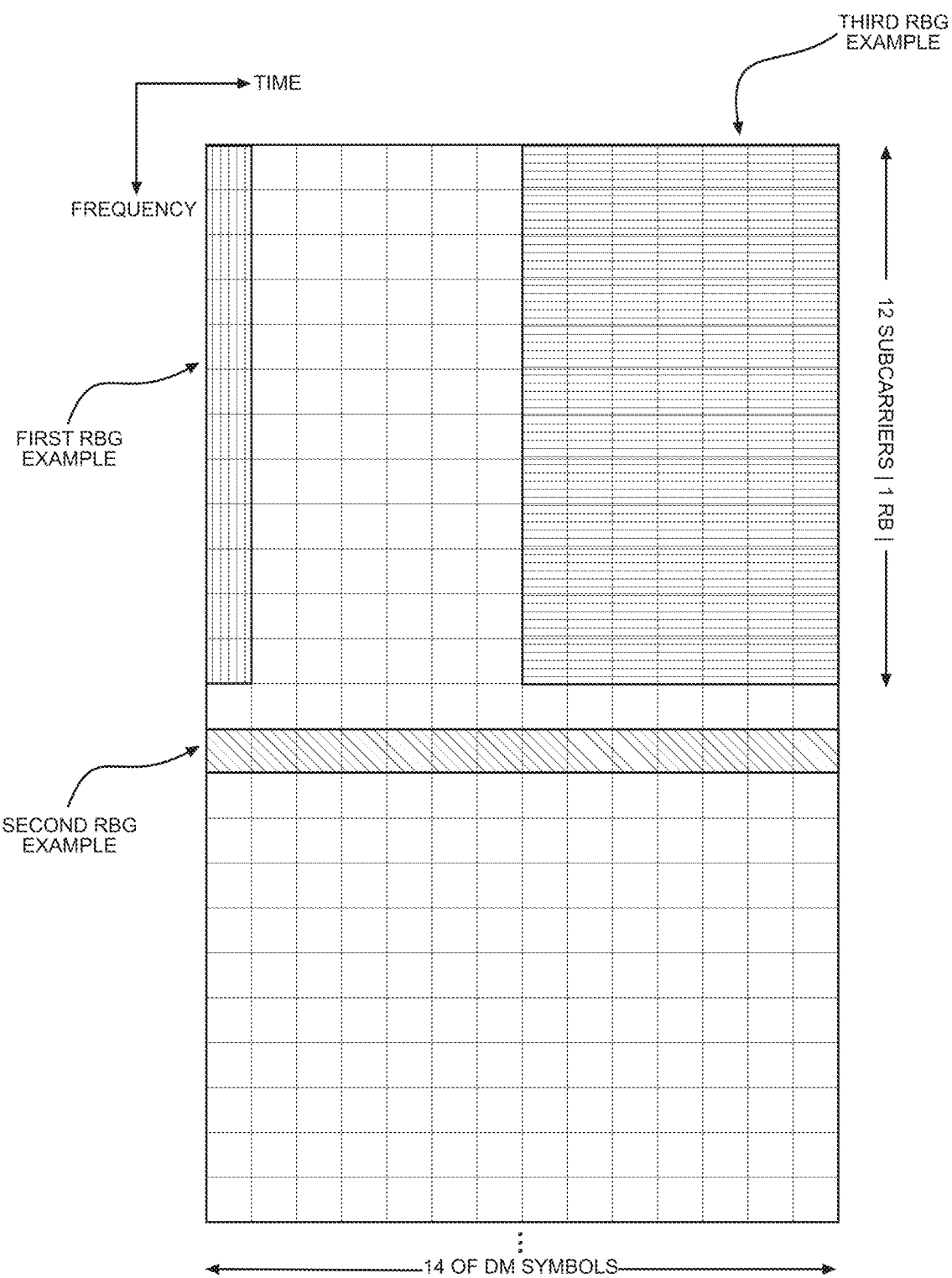
FIG. 6 illustrates simplified examples of various Resource Block Groups (RBGs), according to example embodiments.

FIG. 6 illustrates simplified examples of various RBGs according to example embodiments. In FIG. 6, it is assumed that for each layer, and for each bit position, the RBG is defined as a subset of frequency and time domain resources.

Referring to FIG. 6, in the first example, the RBG is defined to contain 12 subcarriers (or 1 RB) per OFDM symbol. In a second example, the RBG is defined as 14 REs over all 14 OFDM symbols per slot, but only over one subcarrier in the frequency domain. In yet another example, the RBG is defined over 12 subcarriers in the frequency domain and 7 OFDM symbols in the time domain. These examples can be easily extended to cover also relevant bit positions and to extend over multiple UE layers.

At S404, the compression module 1052 then extracts sign values for samples from the divided LLR data and converts the divided LLRs into positive values to obtain converted LLR data. In one example, the compression module 1052 may extract and separate the sign bits into a separate data structure, such as a sign matrix, leaving absolute values of LLRs. According to at least one example embodiment, the sign matrix may be a matrix containing the sign for each RE per RBG.

The divided LLR data representing negative values are then converted into positive values by, for example, flipping all bits of the LLR data and adding 1 to the result.

In at least one example embodiment, at S404 the input mantissa value 0 is assumed to have sign corresponding to "+1". This is a valid approximation, as LLR values with absolute value of 0 have 50% probability of being either 0 or 1, so casting it to +1 is correct 50% of the cases. The only exception in value casting refers to the smallest negative value. For example, if it is again assumed an 8-bit word length, then value −128 is presented as 1000 0000, which cannot be presented as positive value as the positive range is limited to 127 (i.e., interval [0,127]). In this case, the conversion takes place only by bit flipping, resulting in 0111 1111.

A more specific example of the operations performed at S404 in 2's complement format and assuming 8-bit word length will now be described. In this example, −5 is represented as '1111 1011', with the sign bit (the left most value) being '1' representing a negative value. Extracting the sign bit leaves '111 1011', which is then converted into a positive value by flipping all bits (0→1, 1→0) and adding 1 to obtain '000 0101'.

By extracting the sign bit, at least the remaining processing steps may be simplified relative to conventional methods, as only the positive range and limits need be considered.

At S406, the compression module 1052 identifies a maximum exponent per RBG and limits the minimum exponent value to 0 to support the RBG of size 1 based on the maximum exponent value.

In one example, the compression module 1052 obtains the maximum exponent value maxValue per RBG according to Equation (1) shown below.

$$\text{maxValue} = \max(x) \quad (1)$$

In Equation (1), x represents the set of mantissa samples within the RBG.

To limit the minimum exponent value, the compression module 1052 computes the exponent rawExp for the RBG according to Equation (2) shown below.

$$\text{rawExp} = \max(\text{floor}(\log_2(\text{maxValue})+1),0) \quad (2)$$

In Equation (2), $\log_2$ takes the base 2 logarithm of the maximum exponent value maxValue, and floor($\log_2$(maxValue)+1) obtains the most significant bit of the maximum exponent value maxValue. Taking a maximum with 0 is added according to example embodiments to suppress and/or avoid errors due to taking the logarithm of zero values, which may happen with smaller RBG sizes (e.g., RBG size of 1).

At S408, the compression module 1052 determines a compression scaling factor CompScaler and scales the output mantissa samples from S404 based on the determined compression scaling factor CompScaler. The compression module 1052 may determine the compression scaling factor CompScaler based on the exponent rawExp and the output mantissa length unsignedMantissaLengthOut obtained from the compression parameters. By extension, the compression module 1052 may scale the output mantissa samples based on the exponent rawExp and the output mantissa length unsignedMantissaLengthOut.

More specifically, for example, the compression module 1052 may compute a scaling exponent scaleExp according to Equation (3) shown below, and then obtain the compression scaling factor CompScaler according to Equation (4) shown below.

$$\text{scaleExp} = \max(\text{rawExp} - \text{unsignedMantissaLengthOut}, 0) \quad (3)$$

$$\text{CompScaler} = 2^{-\text{scaleExp}} \quad (4)$$

In Equation (3), the word length defines the number of output bits including sign bit. Unlike the BFP algorithm described at section A.1.2 in O-RAN.WG4.CUS.0-R003-v13.00, the scaling exponent here is determined based on the unsigned mantissa length.

The compression module 1052 may then scale the output mantissa samples x by multiplying the compression scaling factor CompScaler with the output mantissa samples according to Equation (5) shown below to obtain a scaled output mantissa sample $x_{scaled}$.

$$x_{scaled} = \text{CompScaler} * x \quad (5)$$

At S410, the compression module 1052 removes unused bits and limits the maximum value for the symmetric range to obtain the compressed data discussed above with regard to FIG. 3. In one example, the compression module 1052 may achieve this by rounding and truncating the output mantissa samples to obtain the compressed data.

For example, the scaled output mantissa samples $x_{scaled}$ may be rounded (round(x_scaled)), the maximum values of the rounded results may be limited according to $2^{\text{unsignedMantissaLengthOut}} - 1$, and the most significant bits may be dropped to limit the maximum value for the symmetric range.

In a more specific example of the method described with regard to FIG. 4, if a mantissa has a value x=103 represented as 0110 0111, the maxValue per RBG=127=($2^7-1$), and the unsignedMantissaLengthOut=3, then rawExp=7, scaleExp=4, CompScaler=$2^{-4}$=0.0625, the scaled mantissa sample $x_{scaled}$=6.4375, and the rounded, scaled mantissa sample round($x_{scaled}$)=6=000 0110. The leading 4 zeros of the rounded scaled mantissa sample are then discarded or dropped to limit the maximum value for the symmetric range and obtain the compressed output mantissa M having the unsigned output mantissa length of 3 bits.

Still referring to FIG. 4, at S412, the compression module 1052 outputs the compressed data for transmission by the RU 180A to the DU 160. The compressed data may include sign S per LLR value per RBG (e.g., as the sign matrix mentioned above), compressed mantissa representation M per LLR value per RBG, and a common (RBG specific) scale exponent scaleExp over all LLR values within one RBG.

According to one or more example embodiments, the overall number of bits per RBG is defined as $K_{RBG}*(N_S+N_M)+N_{scaleExp}$, where $K_{RBG}$ is the number of LLRs per RBG, $N_S$=1 is the number of bits for the sign per LLR, $N_M$ is the number of (unsigned) mantissa bits per compressed LLR, and $N_{scaleExp}$ is the number of bits for the RBG wise exponent.

In an example assuming an 8-bit input and a RBG size of 12 LLRs, the input side RBG needs 12*(1+7)+0=96 bits. Utilizing the compression algorithm described herein, however, with $N_M$=3 and $N_{scaleExp}$=3 for the compressed output, only 12*(1+3)+3=51 bits per RBG are needed. As one can appreciate, the compression ratio in this example is about 0.47.

According to one or more other example embodiments, S404 may be omitted from the method shown in FIG. 4, such that the sign bits are not extracted and the LLRs are not converted to positive values.

Figure 5:
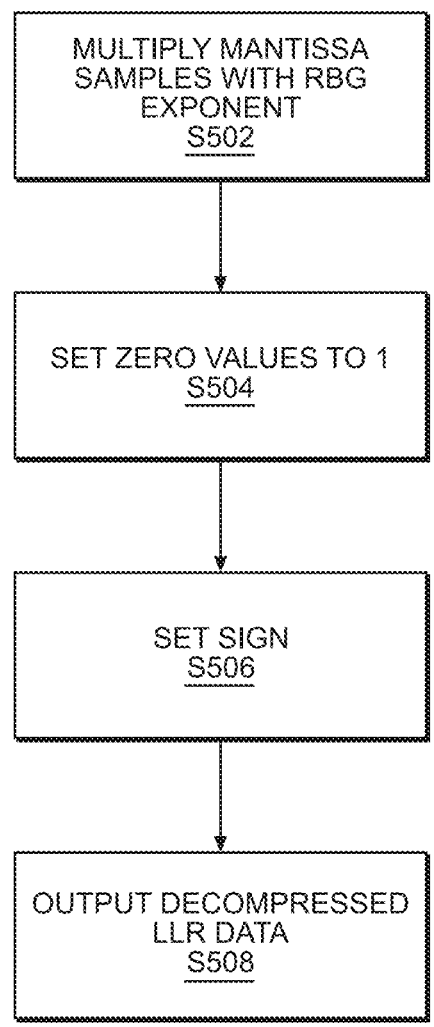
FIG. 5 is a flow chart illustrating a method for LLR decompression according to example embodiments.

FIG. 5 is a flow chart illustrating a method for decompressing received data according to example embodiments.

Referring to FIG. 5, upon receiving the compressed LLR data from the RU 180A via the fronthaul network 170, after some initial signal processing, at S502 the decompression module 1054 multiplies the received mantissa samples M with a decompression scaling factor DecompScaler to obtain scaled mantissa samples. The decompression scaling factor DecompScaler is based on the scale exponent scaleExp for each RBG as shown below in Equation (6).

$$\text{DecompScaler} = 2^{scaleExp} \quad (6)$$

In the above-discussed example where the mantissa value is M=110 and the scale exponent is scaleExp=4, the decompression module 1054 multiplies the mantissa value M by the decompression scaling factor DecompScaler=24, thereby shifting the mantissa value M to the left by 4 bits and obtaining 110 0000 as the result. It is noted that the total number of bits in the output of this stage depends on the parameterization of the decompression module. In the case of a larger word length for decompressed data than for the original uncompressed LLRs, this may be modeled by using least significant bits of the larger word length. If the word length for decompressed data is smaller than the original uncompressed LLRs, the decompression module 1054 may calculate the difference (delta) between the word length of the original uncompressed LLRs (inputWordlength) and the word length for the decompressed data at the decompression module (outputWordlength) according to Equation (7) shown below, and then an updated scale exponent may be calculated (to update RBG specific exponents) according to Equation (8) shown below.

$$\text{delta} = \text{inputWordlength} - \text{outputWordlength} \quad (7)$$

$$\text{scaleExp}_{updated} = \text{scaleExp} - \text{delta} \quad (8)$$

In this case, the updated scale exponent scaleExpupdated may have a negative value. In a specific example, if the compressed LLR data is 1101, the inputWordLength=8, the outputWordlength=6, and scaleExp=0, then the updated scale exponent scaleExpupdated=[0−(8−6)]=−2. Once the scaled value is obtained, the value may be rounded (e.g., round(11.01=11).

It is noted that this is only one example manner in which to accommodate differing word lengths, and example embodiments should not be limited to this example.

At S504, the decompression module 1054 sets zero values amongst the resultant values generated at S502 to have a value 1. In this case, it is assumed that the scaled mantissa samples are considered as integers (e.g., with a 3-bit unsigned mantissa, values on the interval [0, 7] may be represented). At operation S504, samples that may have been quantized to zero in the compression stage may be weighted such that the decompressed LLRs do not have any zeros. That is, for example, the decompression module 1054 may add 1 to the zero valued mantissa samples (e.g., 0000 0000+1=0000 0001). It is noted that the decompression module 1054 does not know whether the decompressed value has an absolute value of zero due to quantization or whether the value was originally zero in the compression input. However, by reintroducing sign information (discussed below), channel decoding is provided with information that improves link performance and addresses this potential issue.

At S506, the sign of the transmitted LLR data is reintroduced using the sign matrix to obtain the decompressed LLR data, thereby recovering the transmitted LLR data (or an estimate of the transmitted LLR data). In a more specific example, in 2's complement format, assuming 8-bit word length, then a LLR sample 5 is represented as 0000 0101. In this case, the sign bit (left most value) is 0, representing a positive value. If the sign matrix indicates that the sign of the transmitted LLR data is negative, then the decompression module 1054 may reintroduce the sign of the transmitted LLR data to obtain −5=1111 1011 by flipping all bits (0→1, 1→0) and adding 1.

In an alternative example, if step S404 is omitted from the compression as noted in the alternative discussed above, the signed bit is maintained in the compressed mantissa and S506 may be omitted from the method of FIG. 5 since the sign of the transmitted LLR data need not be reintroduced.

At S508, the decompression module 1054 outputs the recovered LLR data for physical layer processing and transmission on the uplink. Because methods for output and transmission of LLR data, including physical layer processing and transmission on the uplink are generally known, a detailed discussion is omitted.

Figure 7:
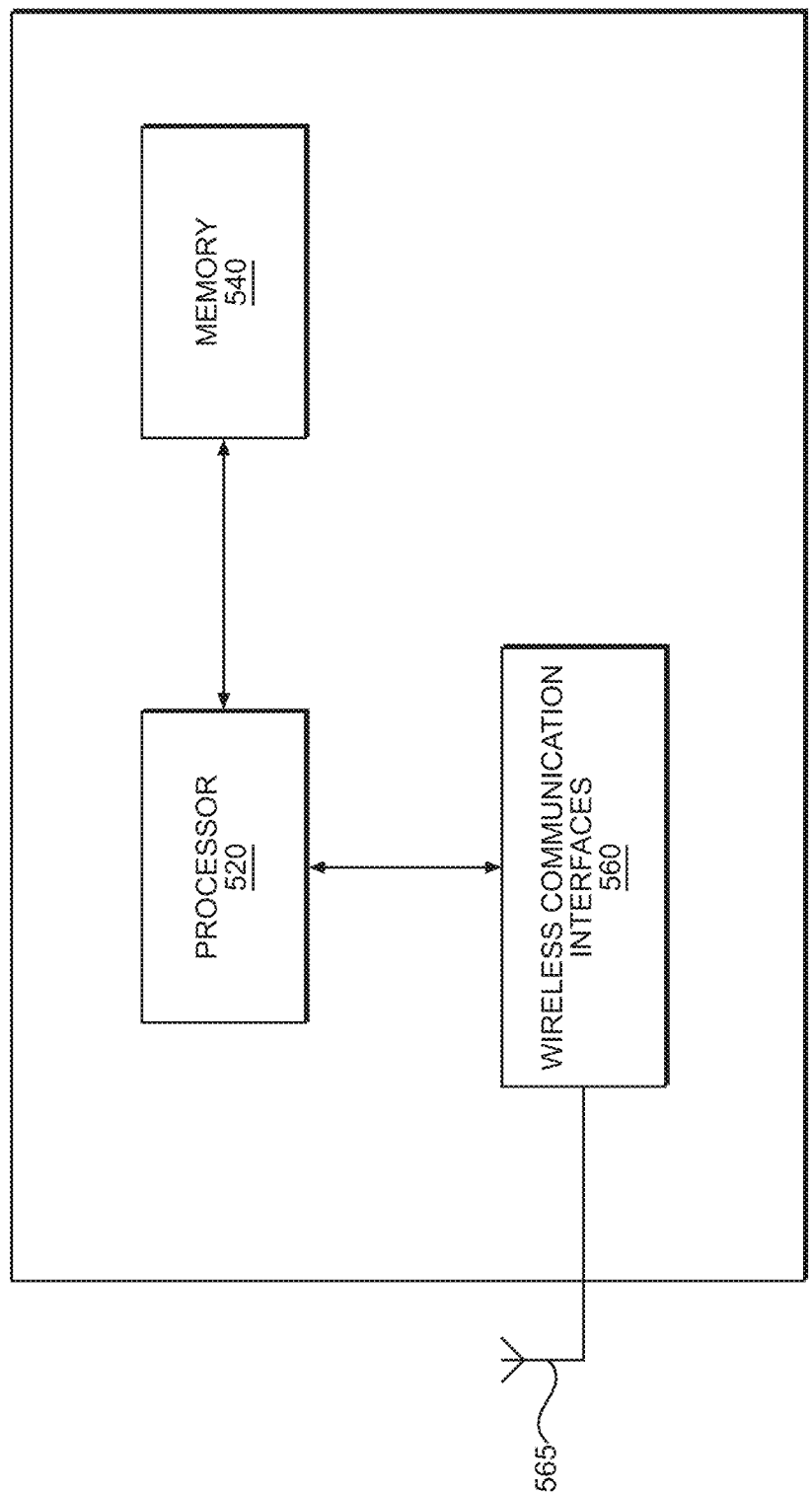
FIG. 7 is a block diagram illustrating an example embodiment of a remote unit.

FIG. 7 illustrates an example embodiment of a DU or RU, such as DU 160 or RU 180A-180C shown in FIG. 1. For example purposes, the network element shown in FIG. 7 will be referred to as RU 180A.

Referring to FIG. 7, the RU 180A includes: a memory 540; a processor 520 connected to the memory 540; various interfaces 560 connected to the processor 520; and one or more (e.g., a plurality of) antennas or antenna panels 565 connected to the various interfaces 560. The various interfaces 560 and the antenna 565 may constitute a transceiver for transmitting/receiving data from/to other network elements (e.g., UEs, other RUs, DUs, gNBs, LMFs, TRPs, etc.) via one or more antenna beams. As will be appreciated, depending on the implementation of the RU, the RU may include many more components (e.g., FPGAs, etc.) than those shown in FIG. 7. However, it is not necessary that all of these generally conventional components be shown in order to disclose the illustrative example embodiment.

The memory 540 may be a computer readable storage medium that generally includes a random access memory (RAM), read only memory (ROM), and/or a permanent mass storage device, such as a disk drive. The memory 540 also stores an operating system and any other routines/modules/applications for providing the functionalities of the RU to be executed by the processor 520. These software components may also be loaded from a separate computer readable storage medium into the memory 540 using a drive mechanism (not shown). Such separate computer readable storage medium may include a disc, tape, DVD/CD-ROM drive, memory card, or other like computer readable storage medium (not shown). In some example embodiments, software components may be loaded into the memory 540 via one of the various interfaces 560, rather than via a computer readable storage medium.

The processor 520 may be configured to carry out instructions of a computer program by performing the arithmetical, logical, and input/output operations of the system. Instructions may be provided to the processor 520 by the memory 540.

The various interfaces 560 may include components that interface the processor 520 with the antenna 565, or other input/output components. As will be understood, the various interfaces 560 and programs stored in the memory 540 to set forth the special purpose functionalities of the RU will vary depending on the implementation of the RU.

The interfaces 560 may also include one or more user input devices (e.g., a keyboard, a keypad, a mouse, or the like) and user output devices (e.g., a display, a speaker, or the like).

One or more example embodiments may negate the need for additional wireline connections between the RU and DU, which may be generally unacceptable to network operators.

With LLR compression, and moving to transport block wise LLR transmission, according to one or more example embodiments, transfer capacity may be reduced (e.g., significantly reduced), which may allow the same or even lower transfer capacity than soft symbol estimate based interface maybe achieved.

Unlike the known BFP algorithm, one or more example embodiments operate per bit position per layer over a time-frequency grid, separately handle sign information, utilize MCS dependent compression parameters (e.g., mantissa length per bit position), may apply lower rate for retransmissions, enable the ability to constrain rate based on transfer capacity limitation, utilize only real values, and may accommodate different RBG definitions.

One or more example embodiments may allow for a relatively high parallelization on the compression process, as each layer and each bit position pair may be compressed separately. This may enable the design of relatively small hardware accelerators (or submodules) for which the capacity is more easily scaled by simply adding instance counts (e.g., 2 Layers, 16-QAM→8 instances vs. 16 Layers, 256-QAM→128 instances.

Illustrative embodiment 1. A radio access network element comprising at least one processor and at least one memory. The at least one memory stores instructions that, when executed by the at least one processor, cause the radio access network element to: extract sign information from a plurality of log-likelihood ratio (LLR) sample values included in LLR data in a resource block group (RBG); convert negative LLR sample values, from among the plurality of LLR sample values, into positive integer values to obtain converted LLR data; generate compressed LLR data based on the converted LLR data; and output the compressed LLR data.

Illustrative embodiment 2. The radio access network element of illustrative embodiment 1, wherein the at least one memory stores instructions that, when executed by the at least one processor, cause the radio access network element to convert each negative LLR sample value, from among the plurality of LLR sample values, into a positive integer value such that the plurality of LLR sample values includes only positive integer values.

Illustrative embodiment 3. The radio access network element according to any of the preceding illustrative embodiments, wherein the at least one memory stores instructions that, when executed by the at least one processor, cause the radio access network element to: scale LLR sample values of the converted LLR data to obtain scaled LLR sample values; and generate the compressed LLR data based on the scaled LLR sample values.

Illustrative embodiment 4. The radio access network element of illustrative embodiment 3, wherein the at least one memory stores instructions that, when executed by the at least one processor, cause the radio access network element to round and truncate the scaled LLR sample values to generate the compressed LLR data.

Illustrative embodiment 5. The radio access network element of illustrative embodiment 3, wherein the compression scaling factor is based on an exponent value corresponding to a maximum LLR sample value for the RBG and an output LLR sample length for the RBG.

Illustrative embodiment 6. The radio access network element of any of the preceding illustrative embodiments, wherein the compressed LLR data includes the extracted sign information, a compressed representation of each LLR sample value of the converted LLR data, and a scaling exponent for the RBG.

Illustrative embodiment 7. The radio access network element of illustrative embodiment 6, wherein the extracted sign information is part of a sign matrix.

Illustrative embodiment 8. A radio access network element comprising at least one processor and at least one memory. The at least one memory stores instructions that, when executed by the at least one processor, cause the radio access network element to: scale, based on a decompression scaling factor, compressed LLR data including a plurality of LLR sample values for a RBG to obtain scaled LLR data; set zero value samples of the scaled LLR data to a value of 1; and recover decompressed LLR data by introducing sign information to the scaled LLR data.

Illustrative embodiment 9. The radio access network element of illustrative embodiment 8, wherein the decompression scaling factor is based on a scale exponent for the RBG.

Illustrative embodiment 10. The radio access network element of illustrative embodiment 9, wherein the scale exponent for the RBG is based on a compression parameter utilized in compressing the compressed LLR data.

Illustrative embodiment 11. The radio access network element of illustrative embodiment 10, wherein the compression parameter is an output mantissa length.

Illustrative embodiment 12. The radio access network element of any of illustrative embodiments 9-11, wherein the at least one memory stores instructions that, when executed by the at least one processor, cause the radio access network element to: determine a difference between a first word length and a second word length, the first word length being a word length for original uncompressed LLR data corresponding to the compressed LLR data, and the second word length being a word length for the decompressed LLR data; determine an updated scale exponent for the RBG based on the scale exponent and the difference between the first word length and the second word length; and determine the decompression scaling factor based on the updated scale exponent for the RBG.

Illustrative embodiment 13. The radio access network element of illustrative embodiment 12, wherein the at least one memory stores instructions that, when executed by the at least one processor, cause the radio access network element to determine the updated scale exponent for the RBG based on a difference between the scale exponent and the difference between the first word length and the second word length.

Illustrative embodiment 14. The radio access network element of any of illustrative embodiments 8-14, wherein the at least one memory stores instructions that, when executed by the at least one processor, cause the radio access network element to introduce the sign information based on a sign matrix associated with the compressed LLR data.

Illustrative embodiment 15. The radio access network element of illustrative embodiment 14, wherein the sign matrix indicates whether respective scaled LLR sample values of the scaled LLR data are positive LLR sample values or negative LLR sample values, and the at least one memory stores instructions that, when executed by the at least one processor, cause the radio access network element to introduce the sign information for the negative LLR sample values.

Illustrative embodiment 16. The radio access network element of any of illustrative embodiments 8-15, wherein the scaled LLR data includes a plurality of scaled mantissa samples.

Illustrative embodiment 17. A radio access network element comprising at least one processor and at least one memory. The at least one memory stores instructions that, when executed by the at least one processor, cause the radio access network element to: obtain, based on a plurality of input parameters, a plurality of compression parameters for compressing LLR data for an RBG, wherein the plurality of compression parameters include a dimension and size for the RBG, an output mantissa length for the RBG and an exponent length for the RBG, and wherein the input parameters include a transmission channel capacity, a total resource block (RB) count, an input mantissa length, and one of a modulation and coding scheme (MCS) per physical RB (PRB) layer or UE allocation information; and decompress received LLR data based on the plurality of compression parameters.

Illustrative embodiment 18. The radio access network element of illustrative embodiment 17, wherein the plurality of compression parameters are different for UE retransmissions.

Illustrative embodiment 19. The radio access network element of any of illustrative embodiments 17 and 18, wherein the UE allocation information includes at least one of a number of layers per UE, a RB count per UE, a retransmission indicator or an Ultra-Reliable Low Latency Communications indicator.

Illustrative embodiment 20. The radio access network element of illustrative embodiment 19, wherein: the MCS per UE information defines a MCS utilized for a UE, the number of layers per UE defines the number of spatial layers allocated for the UE, the retransmission indicator indicates whether a received transport block to be decompressed is a retransmission, and the Ultra-Reliable Low Latency Communications indicator indicates whether the UE is a Ultra-Reliable Low Latency Communications UE.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

As discussed herein, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at, for example, existing RRHs or other network elements and/or hardware. Such existing hardware may be processing or control circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium," "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine-readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks. For example, as mentioned above, according to one or more example embodiments, at least one memory may include or store computer program code, and the at least one memory and the computer program code may be configured to, with at least one processor, cause a RRH, network element or other network device to perform the necessary tasks. Additionally, the processor, memory and example algorithms, encoded as computer program code, serve as means for providing or causing performance of operations discussed herein.

A code segment of computer program code may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable technique including memory sharing, message passing, token passing, network transmission, etc.

The terms "including" and/or "having," as used herein, are defined as comprising (i.e., open language). The term "coupled," as used herein, is defined as connected, although not necessarily directly, and not necessarily mechanically. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/information being indicated, the conveyance of information used to generate the object/information being indicated, the conveyance of some part or portion of the object/information being indicated, the conveyance of some derivation of the object/information being indicated, and the conveyance of some symbol representing the object/information being indicated.

According to example embodiments, RRHs, or other network elements, or the like, may be (or include) hardware, firmware, hardware executing software or any combination thereof. Such hardware may include processing or control circuitry such as, but not limited to, one or more processors, one or more CPUs, one or more controllers, one or more ALUs, one or more DSPs, one or more microcomputers, one or more FPGAs, one or more SoCs, one or more PLUs, one or more microprocessors, one or more ASICs, or any other device or devices capable of responding to and executing instructions in a defined manner.

Benefits, other advantages, and solutions to problems have been described above with regard to specific embodiments of the invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

What is claimed is:

1. A radio access network element comprising:
   at least one processor; and
   at least one memory storing instructions that, when executed by the at least one processor, cause the radio access network element to
   scale, based on a decompression scaling factor, compressed LLR data including a plurality of LLR sample values for a RBG to obtain scaled LLR data,
   set zero value samples of the scaled LLR data to a value of 1, and
   recover decompressed LLR data by introducing sign information to the scaled LLR data.

2. The radio access network element of claim 1, wherein the decompression scaling factor is based on a scale exponent for the RBG.

3. The radio access network element of claim 2, wherein the scale exponent for the RBG is based on a compression parameter utilized in compressing the compressed LLR data.

4. The radio access network element of claim 3, wherein
   the compression parameter is an output mantissa length, and
   the at least one memory stores instructions that, when executed by the at least one processor, cause the radio access network element to
   determine a difference between a first word length and a second word length, the first word length being a word length for original uncompressed LLR data corresponding to the compressed LLR data, and the second word length being a word length for the decompressed LLR data,
   determine an updated scale exponent for the RBG based on the scale exponent and the difference between the first word length and the second word length, and
   determine the decompression scaling factor based on the updated scale exponent for the RBG.

5. The radio access network element of claim 4, wherein the at least one memory stores instructions that, when executed by the at least one processor, cause the radio access network element to determine the updated scale exponent for the RBG based on a difference between the scale exponent and the difference between the first word length and the second word length.

6. The radio access network element according to claim 1, wherein
   the at least one memory stores instructions that, when executed by the at least one processor, cause the radio access network element to introduce the sign information based on a sign matrix associated with the compressed LLR data,
   the sign matrix indicates whether respective scaled LLR sample values of the scaled LLR data are positive LLR sample values or negative LLR sample values, and
   the at least one memory stores instructions that, when executed by the at least one processor, cause the radio access network element to introduce the sign information for the negative LLR sample values.

7. A method comprising:
   scaling, based on a decompression scaling factor, compressed LLR data including a plurality of LLR sample values for a RBG to obtain scaled LLR data,
   setting zero value samples of the scaled LLR data to a value of 1, and
   recovering decompressed LLR data by introducing sign information to the scaled LLR data.

8. The method of claim 7, wherein the decompression scaling factor is based on a scale exponent for the RBG.

9. The method of claim 8, wherein the scale exponent for the RBG is based on a compression parameter utilized in compressing the compressed LLR data.

10. The method of claim 9, wherein
    the compression parameter is an output mantissa length, and
    further comprising:
    determining a difference between a first word length and a second word length, the first word length being a word length for original uncompressed LLR data corresponding to the compressed LLR data, and the second word length being a word length for the decompressed LLR data, determining an updated scale exponent for the RBG based on the scale exponent and the difference between the first word length and the second word length, and determining the decompression scaling factor based on the updated scale exponent for the RBG.

11. The method of claim 10, further comprising determining the updated scale exponent for the RBG based on a difference between the scale exponent and the difference between the first word length and the second word length.

12. The method according to claim 7, further comprising introducing the sign information based on a sign matrix associated with the compressed LLR data, the sign matrix indicates whether respective scaled LLR sample values of the scaled LLR data are positive LLR sample values or negative LLR sample values, and introducing the sign information for the negative LLR sample values.

\* \* \* \* \*